(12) United States Patent
Hobbs et al.

(10) Patent No.: US 7,733,089 B2
(45) Date of Patent: Jun. 8, 2010

(54) TRANSPORTABLE MAGNETIC RESONANCE IMAGING (MRI) SYSTEM

(75) Inventors: Matthew Hobbs, Oxford (GB); Neil Charles Tigwell, Oxon (GB)

(73) Assignee: Siemens Plc, Camberley (GB)

( * ) Notice: Subject to any disclaimer, the term of this patent is extended or adjusted under 35 U.S.C. 154(b) by 930 days.

(21) Appl. No.: 11/508,831

(22) Filed: Aug. 24, 2006

(65) Prior Publication Data

US 2007/0120631 A1    May 31, 2007

(30) Foreign Application Priority Data

Nov. 1, 2005    (GB) ................................. 0522288.0

(51) Int. Cl.
*G01V 3/00*    (2006.01)
(52) U.S. Cl. ..................................... 324/319; 324/318
(58) Field of Classification Search ................. 324/319, 324/318
See application file for complete search history.

(56) References Cited

U.S. PATENT DOCUMENTS

| | | | |
|---|---|---|---|
| 4,181,347 A | 1/1980 | Clark | |
| 5,727,353 A * | 3/1998 | Getz et al. ................... | 52/79.1 |
| 5,994,903 A * | 11/1999 | Ladebeck ................... | 324/319 |
| 6,345,509 B1 | 2/2002 | Garlov et al. | |
| 6,453,680 B1 | 9/2002 | Allen | |
| 7,248,047 B2 * | 7/2007 | Mallett et al. ............... | 324/318 |

OTHER PUBLICATIONS

GB Search Report dated May 22, 2006 (One (1) Page).
Chinese Office Action and translation thereof dated Jan. 29, 2010 (15 pages).

* cited by examiner

*Primary Examiner*—Louis M Arana
(74) *Attorney, Agent, or Firm*—Crowell & Moring, LLP

(57) ABSTRACT

A portable MRI or NMR imaging system comprising a cryogen vessel housing cooled equipment, said system being housed within a transportable container, said container being divided into at least three sections. A first section provides accommodation for an operator and access to equipment as required to operate the cooled equipment. A second section houses the cryogen vessel. A third section houses auxiliary equipment required for operation of the cooled equipment but which is not required to be accessed by the operator to operate the equipment.

Figure 1:
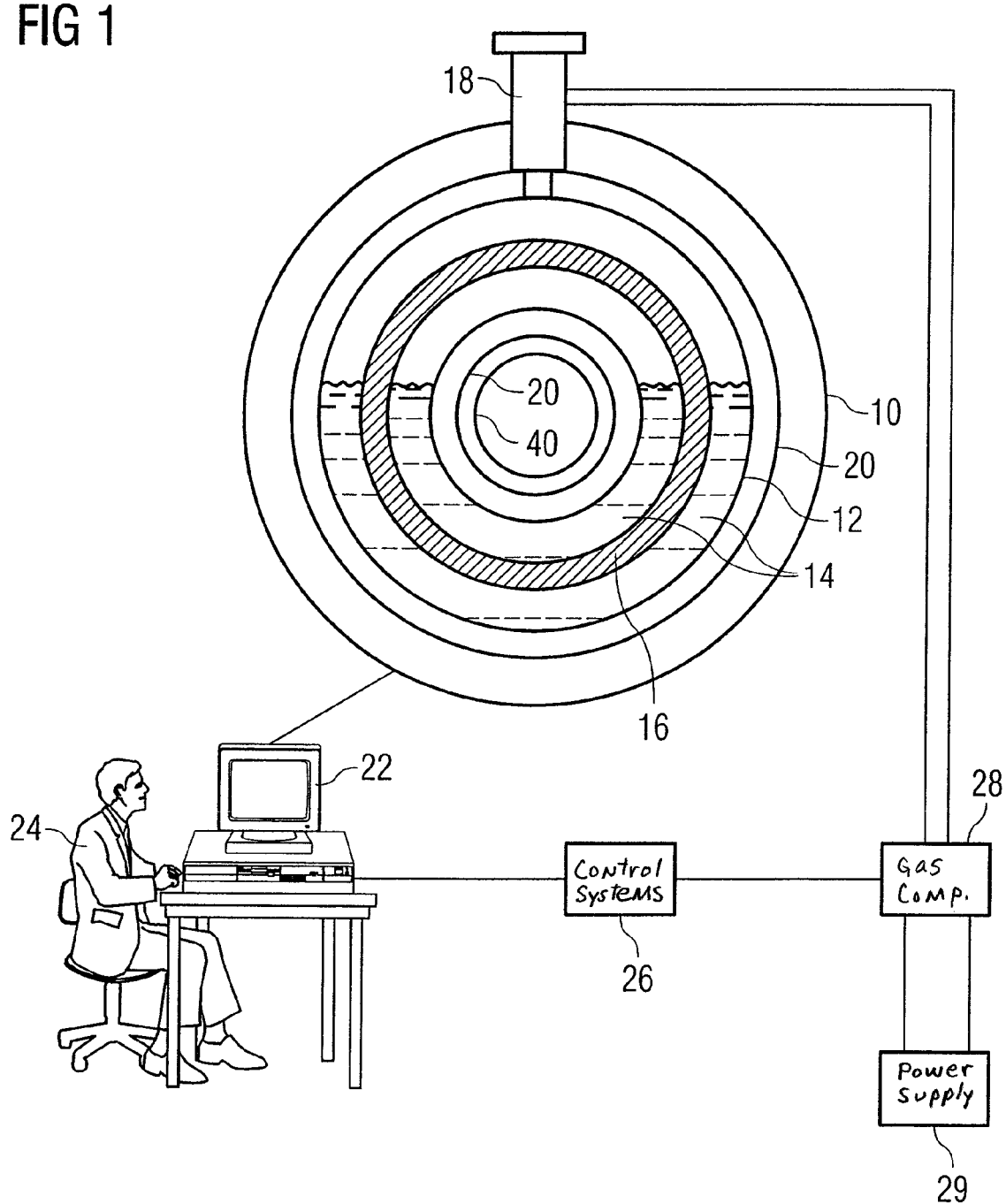

Also provided is a cryostat comprising an outer vacuum container, itself housing a cryogen vessel for containing cooled equipment, wherein space between the cryogen vessel and the outer vacuum container is evacuated. The outer vacuum container is in the form of at least a section of a standard shipping container.

15 Claims, 3 Drawing Sheets

TRANSPORTABLE MAGNETIC RESONANCE IMAGING (MRI) SYSTEM

The present invention relates to systems for nuclear magnetic resonance (NMR) imaging, or magnetic resonance imaging (MRI). In particular, it relates to such systems arranged to be transported in a substantially operative condition, and to be available for use rapidly on arrival at an intended installation site.

Systems for nuclear magnetic resonance (NMR) imaging, or magnetic resonance imaging (MRI), are known to provide valuable information assisting in diagnosis and treatment of various medical conditions. However, such equipment is very costly to purchase, very large and heavy, and current installation methods are largely expensive and relatively permanent. The present invention aims to provide systems for nuclear magnetic resonance (NMR) imaging, or magnetic resonance imaging (MRI) which may be simply and rapidly deployed, and rapidly brought into an operational state. The systems of the present invention are believed to be of particular use in instances where a nuclear magnetic resonance (NMR) imaging, or magnetic resonance imaging (MRI), system is required urgently, or for a limited period of time. The reduced cost of transport and installation of the systems of the invention will reduce the cost of access to such systems.

The systems of the present invention could be easily transported around the world by any convenient mode of transport, and could even be airlifted into remote regions or those suffering natural or man-made disasters.

The present invention accordingly provides a portable MRI or NMR imaging system comprising an imaging magnet having an imaging region, said system being housed within a transportable container. The container is divided into at least three sections: a first section providing accommodation for an operator and access to equipment as required to operate the imaging magnet; and a second section housing the imaging magnet; a third section housing auxiliary equipment required for operation of the imaging magnet but which is not required to be accessed by the operator to operate the imaging magnet, access being provided from the first section to the imaging region of the magnet.

The present invention also provides a cryostat comprising an outer vacuum container, itself housing a cryogen vessel for containing cooled equipment, wherein space between the cryogen vessel and the outer vacuum container is evacuated. The outer vacuum container is in the form of at least a section of a standard shipping container.

Figure 2:
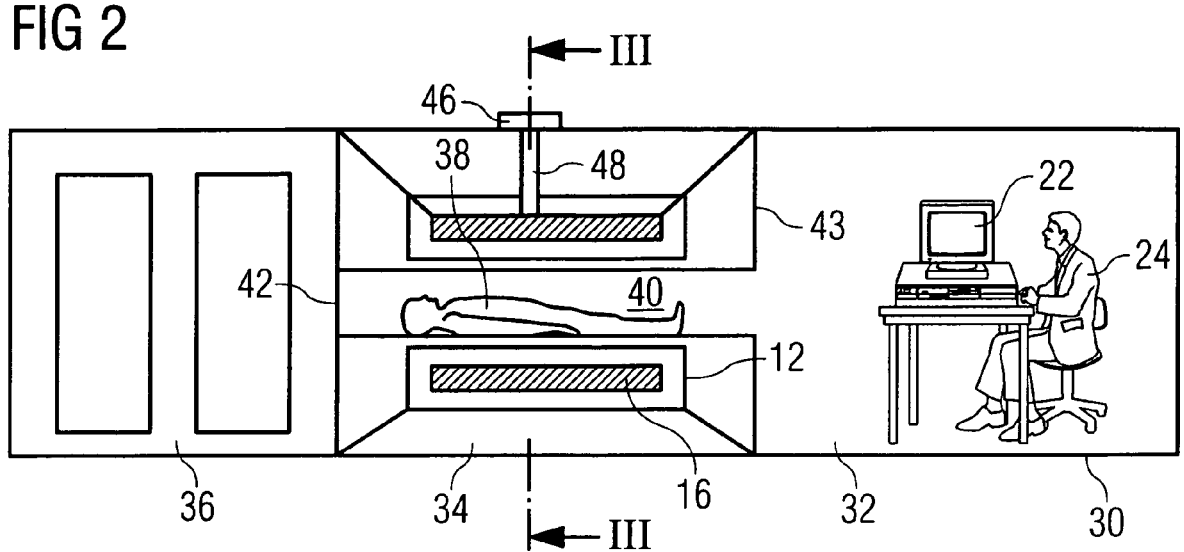
Figure 3:
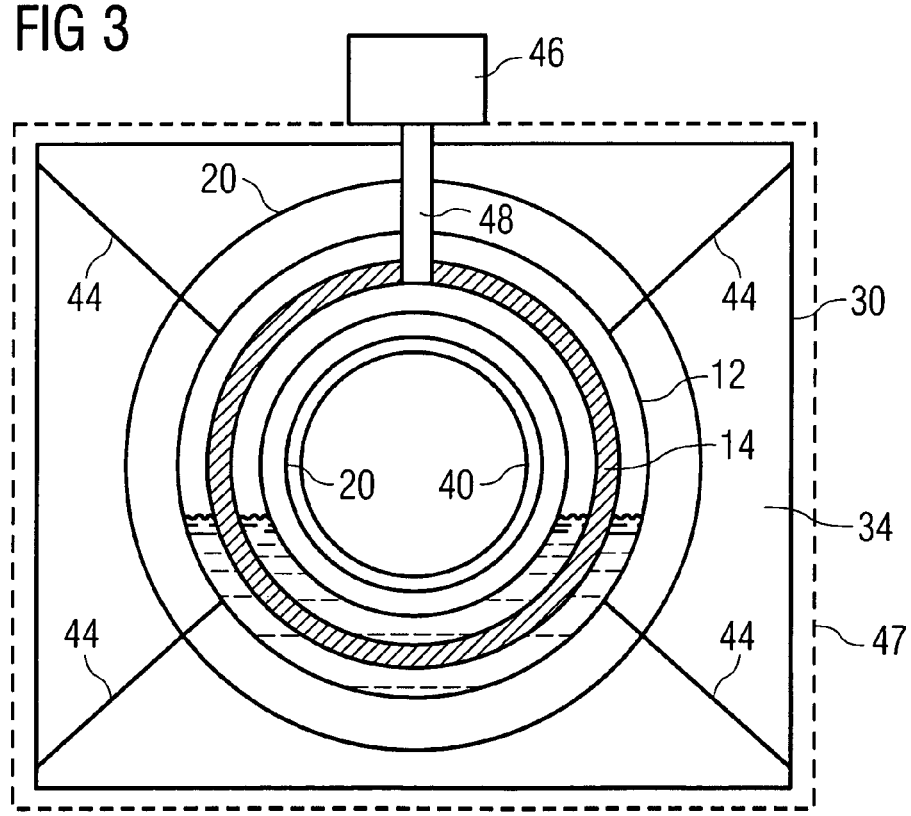
Figure 4:
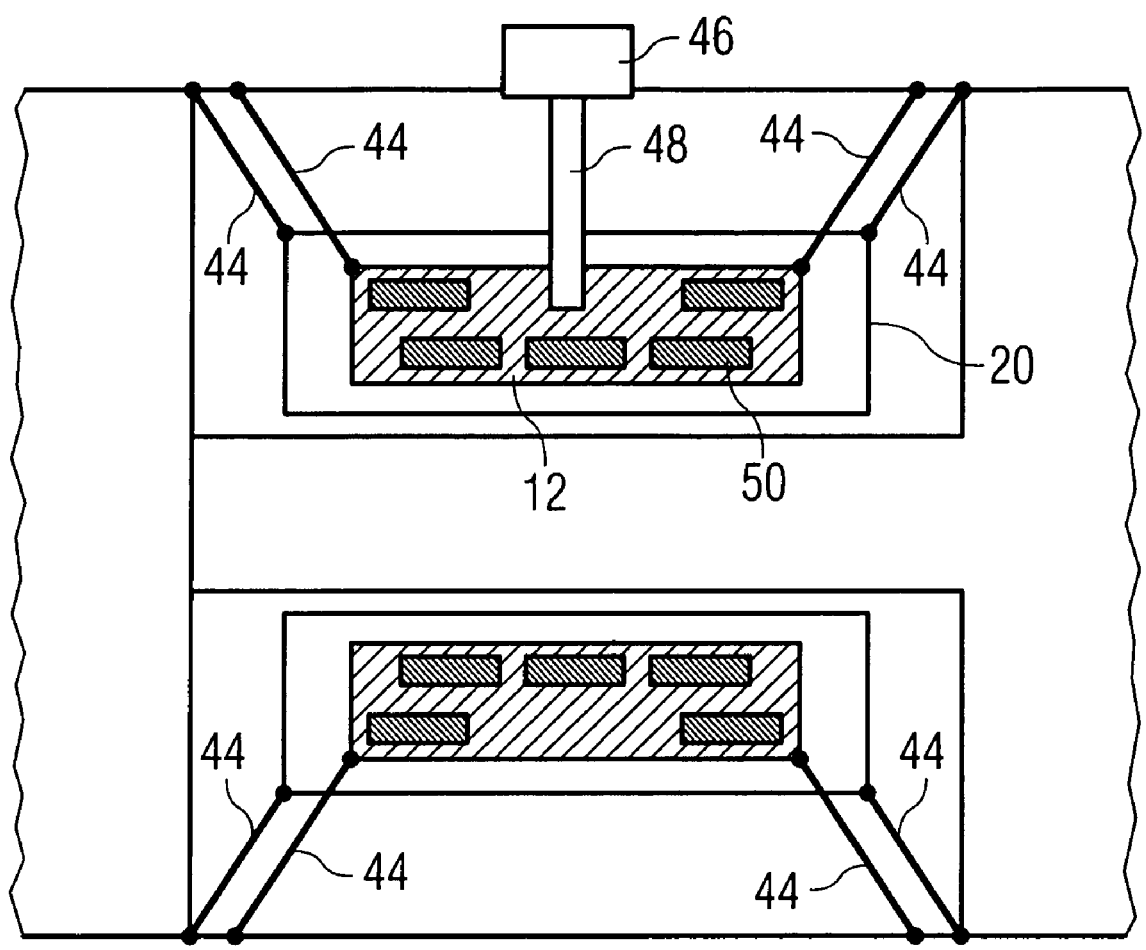

The above, and further, objects, characteristics and advantages of the present invention will become more apparent from consideration of the following description of certain embodiments thereof, given by way of examples only, together with the accompanying drawings, wherein:

FIG. 1 schematically represents the principal components of a conventional NMR or MRI system;

FIG. 2 schematically represents an axial cross section through an NMR or MRI system according to an embodiment of the present invention;

FIG. 3 schematically represents a cross section of the NMR or MRI system of FIG. 2, taken along the line III-III; and FIG. 4 represents an enlarged portion of FIG. 2, representing an axial cross section through the central part of the system of FIG. 2.

FIG. 1 schematically represents the principal components of a system for nuclear magnetic resonance (NMR) imaging, or magnetic resonance imaging (MRI). A cryostat comprises outer vacuum container 10 which contains a cryogenic vessel 12, housing a liquid cryogen 14 and a superconducting magnet 16, cooled to the boiling point of the liquid cryogen. A cryogenic refrigerator 18 is provided to counteract heat influx into the cryogen vessel, and any heat generated within the cryogen vessel by operation of the superconducting magnet. As is well known, the system will comprise many magnetic coils, for generating a uniform imaging field, a gradient field and a high frequency RF field. Shielding and other coils may also be provided. A central patient bore 40 is provided, to provide access to an imaging region for placement of a patient for imaging. Thermal radiation shields 20 are provided to reduce heat influx into cryogen vessel 12 by radiation from the outer vacuum container 10.

A controlling computer 22 is typically employed to control currents flowing in the various magnetic coils and to receive and process image data. An operator 24 operates the computer. Control systems 26, typically electronic systems, and further equipment such as gas compressors 28, a supply of electrical power, cooling arrangements 29 for cooling the compressor and possibly also other equipment, must also be provided.

FIG. 2 shows an axial section through an embodiment of the present invention, comprising an MRI system housed within a container 30 of dimensions identical to those of standard shipping container. Such shipping containers are familiar sights all over the world, and provide a convenient storage and transport container for all manner of goods. The containers may be carried singly on lorries or railway carriages, or in large quantities on cargo ships. They may be loaded into aircraft cargo holds for air freight carriage. The containers are typically provided in standard length of 20 feet (6.1 m) or 40 feet (12.2 m). The containers are typically formed from corrugated sheet steel mounted on a frame of steel members. The shipping container employed in the present invention may be one such typical container, or may be a specially designed and constructed container which meets the standards of external dimensions and other required characteristics of such standard shipping containers, while providing specific characteristics such as mechanical strength as required for the present invention.

As illustrated in FIG. 2, the container 30 may be divided into three distinct regions 32, 34, 36.

The first region 32, which may conveniently be referred to as the computer area preferably houses the computer 22 and provides accommodation for the operator 24. This region also accesses the patient bore 40 of the magnet of the NMR or MRI system. Within this computer area, a patient 38 is received, prepared for imaging, and is inserted into the patient bore 40. The operator 24 operates the computer 22 to ensure that the system is operated correctly to derive images useful for the diagnosis or treatment of any condition that the patient 38 may be suffering.

The second region 34, which may conveniently be referred to as the MRI area, houses the MRI magnet 16 itself, typically a solenoidal magnet with a central patient bore 40 arranged along the long axis of the container 30. Other orientations are of course possible within the mechanical limits of the sizes of the magnet and the container. This region will be described in more detail below. "Looks" covers are preferably provided to cover the bulkhead 43, and the interior of the patient bore 40, to improve the aesthetic appearance of the MRI system from the point of view of the operator 24 and the patient 38.

The third region 36, which may conveniently be referred to as the cabinet area, contains the remaining equipment, such as electrical power supply; gas compressor; cooler for the compressor; fuel, gas and water tanks—equipment which does not need to be accessed by the operator 24 during operation of the MRI system.

FIGS. 3 and 4 illustrate the MRI area 34 of a certain embodiment of the present invention in more detail. According to this embodiment of the invention, the part of the container 30 housing the MRI area 34, comprising walls of the container and suitable sealed bulkheads 42, 43 forms an outer vacuum container around the cryogen vessel. The sealed bulkheads 42, 43 provide a closed vacuum container. The container 30 walls and bulkheads 42, 43 are made of an electrically conductive material, such as steel. This serves to provide magnetic and RF shielding of the magnet from external interferences, and to limit leakage of the magnetic field from the MRI system out of the container 30.

As illustrated in FIG. 3, the magnetic shielding afforded by the material of the container 30 is in closer proximity than magnetic shielding typically employed in conventional MRI installations. The design of the MRI magnet may need to be adjusted to take the close proximity of the magnetic shielding into account. Thermal radiation shields 20 are placed between the wall of the container and the cryogen vessel, and between the cryogen vessel and the patient bore 40 to prevent heat influx by thermal radiation from the walls of the container 30. In order to stabilise, and possibly further limit, the rate of thermal influx by radiation from the walls of the container, a covering of thermal isolation 47 is preferably provided, on either the inner or outer surfaces of the walls and bulkheads of the MRI area.

By using the container walls and bulkheads as the outer vacuum chamber for the cryostat, suspension components 44 which support the magnet 16 and cryogen vessel 12 may be designed to be of the maximum possible length, longer than would be the case for a concentric cylindrical outer vacuum chamber 10 of similar dimensions. Such elongated suspension components provide increased thermal resistance as compared to conventional suspension components, reducing the rate of heat influx to the cryogen vessel by conduction through the suspension elements.

As illustrated in FIG. 3, the cryogenic refrigerator and service turret 46 may be mounted so as to be accessible from the exterior of the container. This makes servicing of the system considerably easier. The neck tubes 48 of the system, which house the cryogenic refrigerator and provide access to the cryogen vessel for servicing, may be lengthened as compared to neck tubes provided for MRI systems having a conventional coaxial cylindrical outer vacuum container 10. This serves to provide increased thermal resistance as compared to conventional neck tubes, reducing the rate of heat influx to the cryogen vessel by conduction through the neck tubes.

It may be advantageous to provide a recess in the body of the container 30, to accommodate cryogenic refrigerator and service turret 46 in such a manner that they do not significantly protrude outside of the dimensions of the container 30.

FIG. 4 illustrates support members 44 provided to retain the cryogen vessel 12, and to retain the thermal radiation shields. In the drawings, not all components are illustrated for clarity. A typical arrangement of superconducting coils 50 is also schematically illustrated in FIG. 4.

The magnet may be mounted on anti-vibration mounts within the container, or the whole container 30 may be mounted on anti-vibration mounts. By providing anti-vibration mounts for the whole container, it is also possible to protect against floor-borne vibrations within buildings from detrimentally affecting the images produced by the MRI system when in operation.

The MRI or NMR system according to the present invention may be employed in two main arrangements: a mobile configuration, and an in-situ configuration.

In the mobile configuration, the MRI system is transported to a temporary location, typically by lorry, operated in a substantially stand-alone manner for a required period of time, and then transported to a next temporary location. A low cost MRI service may be provided, by unloading the system at the hospital/clinic site for the duration of the stay, or by stabilising the lorry and operating the system on board the lorry. Advantageously, the container may be mounted on anti-vibration mountings while on the lorry, and/or when unloaded.

When employed in an in-situ configuration, the MRI system of the invention is delivered as a modular component to be built in to a new or existing building. The advantage of the present invention in such installations is that the installation time on site will be significantly reduced, and the connections between the magnet and its auxiliary equipment will already have been connected and tested. The system may be delivered, installed in an appropriate location, connected to supplies of electricity and cryogen, and be ready for use very soon after delivery. Advantageously, the container may be mounted on anti-vibration mountings when installed.

The distribution of the equipment within the container 40 would need to be carefully considered during the design of an MRI system according to the present invention, to provide for safe lifting of the container during transport. This is particularly important if the system is to be sent by commercial freight services, whose operators will be unaware of the content of the container.

In order to assume that the MRI Magnet is at its operating temperature on arrival at its destination, the cryogen vessel should be filled with a significant quantity of liquid cryogen: plenty to maintain the magnet at operating temperature during the longest envisaged transport time, and enough to maintain operating temperature during the time of deployment of a mobile system, since it may be difficult to ensure a supply of liquid cryogen for topping up at the deployment site. Once in use, the cryogenic refrigerator will cool the system, reducing or eliminating cryogen boil off.

In a preferred embodiment, the portable MRI or NMR system of the invention is provided with an electrical generator, a gas compressor and suitable cooling apparatus such that the cryogenic refrigerator may be operated while the system is in transit, thereby reducing or eliminating cryogen boil off.

While the present invention has been described with particular reference to MRI systems, the present invention may usefully be applied to any systems, particularly medical systems, requiring cryogenic cooling of some part. Similarly, while the present invention has been described with reference to systems including a magnet cooled by immersion in a cryogen vessel, the present invention may be applied to magnets cooled by other means, or even to magnets which do not require cooling. Such alternatives fall within the scope of one or more of the appended claims.

Standard shipping containers are available in a range of sizes, including the following most common sizes. These sizes are regulated by ISO the International Organization for Standardization.

Shipping containers are designed in several ISO standard configurations. The most used shipping containers in freight transportation industry are believed to be 20 ft and 40 ft shipping containers, which together are believed to account or about 80-90% of the total number of existing shipping containers.

The shipping container sizes below are industry standard, however small variations in shipping container sizes can occur depending on which shipping lines are used. Other standard sizes include 45 ft (13.7 m), 48 ft (14.6 m) and 53 ft (16.2 m), particularly in the USA.

| Standard External Container Dimensions | | | | |
|---|---|---|---|---|
| | (10 ft) | (20 ft) | (30 ft) | (40 ft) |
| Container Length | 3.05 m | 6.06 m | 9.12 m | 12.19 m |
| Container Width | 2.44 m | 2.44 m | 2.44 m | 2.44 m |
| Container Height: | | | | |
| Standard | 2.59 m | 2.59 m | 2.59 m | 2.59 m |
| High cube | 2.89 m | 2.89 m | 2.89 m | 2.89 m |

| Standard Internal Container Dimensions | | | | |
|---|---|---|---|---|
| Internal Length | 2.80 m | 5.87 m | 8.93 m | 12.00 m |
| Internal Width | 2.33 m | 2.33 m | 2.33 m | 2.33 m |
| Internal Height: | | | | |
| Standard | 2.35 m | 2.35 m | 2.35 m | 2.35 m |
| High cube | 2.65 m | 2.65 m | 2.65 m | 2.65 m |
| End Door Aperture Width: | as required | 2.28 m | 2.28 m | 2.28 m |
| End Door Aperture Height: | | | | |
| Standard | as required | 2.26 m | 2.26 m | 2.26 m |
| High cube | as required | 2.56 m | 2.56 m | 2.56 m |
| Floor area | 6.69 m$^2$ | 13.93 m$^2$ | 21.09 m$^2$ | 28.33 m$^2$ |
| Cubic capacity: | | | | |
| Standard | 15.89 m$^3$ | 32.85 m$^3$ | 49.84 m$^3$ | 66.83 m$^3$ |
| High cube | 17.84 m$^3$ | 37.09 m$^3$ | 56.21 m$^3$ | 75.32 m$^3$ |
| Weight | 1.52 tonnes | 2.23 tonnes | 2.84 tonnes | 3.35 tonnes |

The invention claimed is:

1. A portable MRI or NMR imaging system comprising an imaging magnet having an imaging region, said system being housed within a transportable container, said container being divided into at least three sections:
   a first section providing accommodation for an operator and access to equipment as required to operate the imaging magnet; and
   a second section housing the imaging magnet;
   a third section housing auxiliary equipment required for operation of the imaging magnet but which is not required to be accessed by the operator to operate the imaging magnet; wherein,
   access is provided from the first section to the imaging region of the magnet; and
   the second section of the transportable container forms an outer vacuum container, itself housing a cryogen vessel for containing the imaging magnet, wherein space between the cryogen vessel and the outer vacuum container is evacuated.

2. A portable MRI or NMR imaging system according to claim 1, wherein the transportable container is in the form of a standard shipping container.

3. A portable MRI or NMR imaging system according to claim 2, wherein suspension components which support the imaging magnet are mounted towards corners of the second section, whereby such suspension components are of length longer than would be the case for a concentric cylindrical outer vacuum chamber of similar dimensions.

4. A portable MRI or NMR imaging system according to claim 1, wherein the imaging magnet comprises a superconducting magnet cooled to a temperature below its transition temperature.

5. A portable MRI or NMR imaging system according to claim 4, wherein the imaging magnet is cooled by immersion in a liquid cryogen within a cryogen vessel, the cryogen vessel being provided with a cryogenic refrigerator and a service turret mounted so as to be accessible from the exterior of the container.

6. A portable MRI or NMR imaging system according to claim 5 wherein a recess is provided in the body of the container, to accommodate the cryogenic refrigerator and the service turret in such a manner that they do not significantly protrude outside of the dimensions of the container.

7. A portable MRI or NMR imaging system according to claim 1, wherein walls of the portable container, and bulkheads if any, are composed of an electrically conductive material, thereby providing magnetic screening of the imaging magnet.

8. A portable MRI or NMR imaging system according to claim 1, wherein a covering of thermal isolation is provided, on either the inner or outer surfaces of walls of the second section.

9. A portable MRI or NMR imaging system according to claim 1, wherein the imaging magnet is supported on anti-vibration mounts within the container.

10. A portable MRI or NMR imaging system according to claim 1, wherein the container is mounted on anti-vibration mounts.

11. A portable MRI or NMR imaging system according to claim 1, wherein the transportable container is in the form of a standard shipping container, and the second section housing the imaging magnet forms an outer vacuum chamber, with at least one sealed bulkhead separating the first section from the second and third sections.

12. The system according to claim 11, wherein said imaging magnet is a cylindrical magnet.

13. The system according claim 1, wherein said imaging magnet is a cylindrical magnet.

14. A cryostat comprising:
   an outer vacuum container;
   a cryogen vessel housed in said outer vacuum container, for containing cooled equipment;
   the outer vacuum container is formed by at least a portion of a standard shipping container; and
   space between the cryogen vessel and said at least a portion of said standard shipping container is evacuated.

15. A portable cryogenic device comprising:
   a transportable shipping container; and
   a cryogenic system housed within said shipping container, said cryogenic system comprising:
   a cryogen vessel; and
   a cryogenically cooled apparatus disposed within said cryogen vessel; wherein
   said cryogen vessel is supported within an outer vacuum chamber;
   outer walls of said transportable shipping container form said outer vacuum chamber; and
   space between said cryogen vessel and said outer walls of said shipping container is evacuated.

* * * * *